US010700508B2

(12) United States Patent
Ha et al.

(10) Patent No.: US 10,700,508 B2
(45) Date of Patent: Jun. 30, 2020

(54) PROTECTION APPARATUS

(71) Applicant: General Electric Technology GmbH, Baden (CH)

(72) Inventors: Hengxu Ha, Stafford (GB); Sankara Sri Gopala Krishna Murthi, Stafford (GB)

(73) Assignee: General Electric Technology GmbH, Baden (CH)

( * ) Notice: Subject to any disclaimer, the term of this patent is extended or adjusted under 35 U.S.C. 154(b) by 355 days.

(21) Appl. No.: 15/553,250

(22) PCT Filed: Feb. 25, 2016

(86) PCT No.: PCT/EP2016/054029
§ 371 (c)(1),
(2) Date: Aug. 24, 2017

(87) PCT Pub. No.: WO2016/135266
PCT Pub. Date: Sep. 1, 2016

(65) Prior Publication Data
US 2018/0034257 A1    Feb. 1, 2018

(30) Foreign Application Priority Data
Feb. 27, 2015   (EP) ..................................... 15275054

(51) Int. Cl.
*H02H 7/00*   (2006.01)
*H02H 1/00*   (2006.01)
(Continued)

(52) U.S. Cl.
CPC ........... *H02H 1/0007* (2013.01); *G01R 31/08* (2013.01); *G01R 31/086* (2013.01);
(Continued)

(58) Field of Classification Search
None
See application file for complete search history.

(56) References Cited

U.S. PATENT DOCUMENTS 4,475,150 A * 10/1984 D'Atre ................ H02M 5/4505
                                                    318/806
4,670,811 A *  6/1987 Eda .......................... H02H 7/22
                                                    361/45
(Continued)

FOREIGN PATENT DOCUMENTS

EP    1195874 A2    4/2002
EP    1940002 A2    7/2008

OTHER PUBLICATIONS

International Search Report and Written Opinion issued in connection with corresponding PCT application No. PCT/EP2016/054029 dated Apr. 29, 2016.

*Primary Examiner* — Stephen W Jackson
(74) *Attorney, Agent, or Firm* — Eversheds Sutherland (US) LLP

(57) ABSTRACT

In the field of multi-terminal electrical power network protection, a protection apparatus comprises a measurement apparatus to measure the respective terminal current ($I_L$, $I_{R1}$, $I_{R2}$, $I_{R3}$, $I_{R4}$, $I_{R5}$) flowing at each terminal (L, $R_1$, $R_2$, $R_3$, $R_4$, $R_5$) in a multi-terminal network that includes a plurality of electrically interconnected terminals (L, $R_1$, $R_2$, $R_3$, $R_4$, $R_5$). The protection apparatus also includes a control unit that is programmed to process the measured terminal currents ($I_L$, $I_{R1}$, $I_{R2}$, $I_{R3}$, $I_{R4}$, $I_{R5}$) to obtain first and second summed values ($I_{POS}(n)$, $I_{NEG}(n)$). The first summed value ($I_{POS}(n)$) is the sum at a given time (n) of the or each terminal current ($I_L$, $I_{R1}$, $I_{R2}$, $I_{R3}$, $I_{R4}$, $I_{R5}$) flowing in a first direction (Di) relative to a corresponding terminal (L, $R_1$, $R_2$, $R_3$, $R_4$, $R_5$) and the second summed value ($I_{NEG}(n)$) is the sum at the same given time (n) of the or each terminal current ($I_L$, $I_{R1}$, (Continued)

$I_{R2}$, $I_{R3}$, $I_{R4}$, $I_{R5}$) flowing in a second direction ($D_2$) opposite the first direction ($D_1$) relative to the corresponding terminal (L, $R_1$, $R_2$, $R_3$, $R_4$, $R_5$). The control unit is further programmed to compare the phase of the first summed value ($I_{POS}(n)$) with the phase of the second summed value ($I_{NEG}(n)$) to determine whether a fault in the multi-terminal network is internal or external to the multi-terminal network and thereafter to produce an internal fault output signal upon the determination of an internal fault.

10 Claims, 4 Drawing Sheets

(51) Int. Cl.
    *H02H 3/26*     (2006.01)
    *H02H 7/28*     (2006.01)
    *G01R 31/08*     (2020.01)

(52) U.S. Cl.
    CPC .......... *H02H 1/0092* (2013.01); *H02H 3/265* (2013.01); *H02H 7/28* (2013.01)

(56) References Cited

U.S. PATENT DOCUMENTS

| | | |
|---|---|---|
| 5,809,045 A | 9/1998 | Adamiak et al. |
| 10,393,810 B2 * | 8/2019 | Li .................... H02H 3/283 |
| 2003/0071633 A1 | 4/2003 | Fedirchuk et al. |

* cited by examiner

PROTECTION APPARATUS

BACKGROUND OF THE INVENTION

The field of the present disclosure relates generally to a protection apparatus for protecting a multi-terminal electrical power network including a plurality of electrically interconnected terminals.

BRIEF DESCRIPTION OF THE INVENTION

Network protection devices, such as circuit breakers and relays, are activated in the event of a fault to protect electrical power networks.

The reliable activation, i.e. triggering, of such protection devices is highly desirable because a failure to activate in the event of such a fault can have extremely detrimental consequences such as human injuries, power system blackout and considerable damage to nearby power network equipment.

Similarly, incorrect activation of such a device causes unnecessary interruption to the supply of power within the network with likely financial penalties for the network operator.

According to an embodiment of the present invention there is provided a protection apparatus, for protecting a multi-terminal electrical power network, comprising: a measurement apparatus to measure the respective terminal current flowing at each terminal in a multi-terminal network including a plurality of electrically interconnected terminals; and a control unit programmed to process the measured terminal currents to obtain first and second summed values, the first summed value being the sum at a given time of the or each terminal current flowing in a first direction relative to a corresponding terminal, the second summed value being the sum at the same given time of the or each terminal current flowing in a second direction opposite the first direction relative to the corresponding terminal, and the control unit being further programmed to compare the phase of the first summed value with the phase of the second summed value to determine whether a fault in the multi-terminal network is internal or external to the multi-terminal network and thereafter to produce an internal fault output signal upon the determination of an internal fault.

The production of an internal fault output signal permits the triggering of a network protection device, such as a circuit breaker or relay, to protect the power network in the event of a fault within the network, i.e. an internal fault, arising.

The inclusion of a control unit that is able to obtain first and second summed values means that the protection apparatus of an embodiment of the present invention is able to protect an electrical power network with any number of terminals, i.e. there is no upper limit of terminals that a protection apparatus according to an embodiment of the present invention can handle.

In addition, basing the first summed value on currents flowing in a first direction relative to each terminal and the second summed value on currents flowing in a second, opposite direction relative to each terminal provides values that are indicative of whether an internal or external fault has arisen, i.e. by virtue of the relative direction of current flow, but which are independent of the magnitude of current flow. Having indicative values that are independent of the magnitude of current flow provides the protection apparatus of an embodiment of the present invention with a degree of immunity to terminal current measurement errors, e.g. such as those that might arise if one or more elements of the measurement apparatus becomes saturated.

As a consequence, the measurement apparatus needs only to ascertain the correct relative direction of current flow, rather than an accurate measurement of the magnitude of current flow in order for the control unit of an embodiment of the present invention to be able to make the required determination of whether an internal or external fault has occurred. The measurement apparatus and control unit, and hence the protection apparatus of an embodiment of the present invention, therefore exhibit a high degree of immunity to saturation of one or more measuring elements, such as current transformers, within the measurement apparatus.

The protection apparatus of an embodiment of the present invention therefore avoids the need to check and establish the status of the measurement apparatus, e.g. whether one of more elements thereof have become saturated with the result that erroneous current measurements arise.

As a consequence of the foregoing the protection apparatus of an embodiment of the present invention operates more reliably than, e.g. conventional protection apparatuses where accurate measurement of the magnitude of terminal current flow is required.

The need essentially for the measurement apparatus to only accurately establish the relative direction of current flow also means that the performance requirements of the measurement apparatus can be lower than in conventional protection apparatuses, and so the measurement apparatus (and in particular any individual elements thereof) can be smaller and less expensive.

In addition, the subsequent comparison of the respective phases of the first and second summed values with one another can be done so by way of relatively simple calculations, and so can be implemented in relatively simple and inexpensive integrated electronic devices such as programmable microcontrollers and the like.

In an embodiment of the present invention having the control unit programmed to compare the phase of the first summed value with the phase of the second summed value includes the control unit considering whether the difference between the phases is one of 180° or 90°.

Such consideration by the control unit is advantageous because a phase difference of 180° is indicative of an external fault having occurred and a phase difference of 90° is indicative of an internal fault having occurred.

Optionally considering whether the difference between the phases is one of 180° or 90° includes the control unit being programmed to carry out one of: a correlation algorithm; a Fourier based algorithm; and a magnitude comparison algorithm.

Having the control unit so programmed permits the ready assessment of the respective phases of the first and second summed values in a manner which can be straightforwardly implemented in an integrated electronic device, such as a programmable microcontroller.

The control unit being programmed to carry out a magnitude comparison algorithm includes the control unit comparing a sum of the first and second summed values with a difference between the first and second summed values.

Such a comparison is desirably indicative of whether a 180° or 90° phase difference exists between the phases of the first and second summed values, and hence is ultimately indicative of whether an internal or external fault has arisen.

The control unit being programmed to carry out a magnitude comparison algorithm may include the control unit comparing a norm of a sum of the first and second summed values with a norm of a difference between the first and second summed values.

A norm value is less susceptible to perturbations in individual first and second summed values because it is averaged over, e.g. an operating cycle at the fundamental frequency of the electrical power network that the protection apparatus of an embodiment of the present invention is arranged to protect, and so helps to further improve the reliability of the protection apparatus of an embodiment of the present invention.

In an embodiment of the present invention the control unit being programmed to carry out a magnitude comparison algorithm includes the control unit being programmed to establishing a discriminative ratio based on the sum of the first and second summed values and the difference between the first and second summed values and to compare the discriminative ratio with a threshold value.

Establishing a discriminative ratio, and a subsequent comparison of that ratio with a threshold value, may be readily implemented, e.g. within an integrated electronic device, while continuing to reliably distinguish between internal and external faults.

The control unit may be programmed to normalize each of the first and second summed values prior to considering whether the difference between the phases is one of 180° or 90°.

Such normalization of the first and second summed values can help to improve the sensitivity to fault detection of the protection apparatus of an embodiment of the present invention, e.g. in situations where one or more elements of the measurement apparatus has become saturated.

The measurement apparatus includes one or more filters to remove distortion from the measured terminal currents.

Such a filter or filters usefully removes distortion, e.g. such as may arise if one or more elements of the measurement apparatus becomes saturated.

Optionally the protection apparatus further includes a fault severity determination unit to determine the severity of a fault.

The inclusion of such a fault severity determination unit allows for a greater degree of control over when a network protection device is triggered. For example, if the fault severity determination unit determines that a fault is slight (perhaps because no saturation of an element within the measurement apparatus has occurred), triggering of the network protection device by the control unit of an embodiment of the present invention can be inhibited (regardless of whether the control unit of an embodiment of the present invention has determined that an internal fault has occurred), such that triggering of the network protection device is only initiated in the event that some other, e.g. secondary protection apparatus, determines that triggering is required.

Such functionality is desirable since it can be used to prevent operation of the network protection device on the instigation of the protection apparatus of an embodiment of the present invention if the fault is only slight, with activation of the network protection device instead being controlled in such slight fault conditions by, e.g. a more sensitive secondary protection apparatus.

The protection apparatus may further include a secondary protection apparatus input to receive a trip signal from a secondary protection apparatus, and the protection apparatus may be configured to send a master trip signal to a network protection device in dependence of the secondary protection apparatus input receiving a trip signal.

Such an arrangement can, e.g. in severe fault conditions, reduce the sensitivity of the protection provided by an overall protection scheme by limiting the triggering of a network protection device, i.e. in order to protect the power network, to circumstances when both the protection apparatus of an embodiment of the present invention determines that an internal fault has occurred and some secondary protection apparatus, e.g. a differential protection apparatus, additionally considers that such protection is required.

BRIEF DESCRIPTION OF THE DRAWINGS

There now follows a brief description of the embodiments of the present invention, by way of non-limiting example, with reference being made to the following drawings in which.

DETAILED DESCRIPTION OF THE INVENTION

Figure 1:
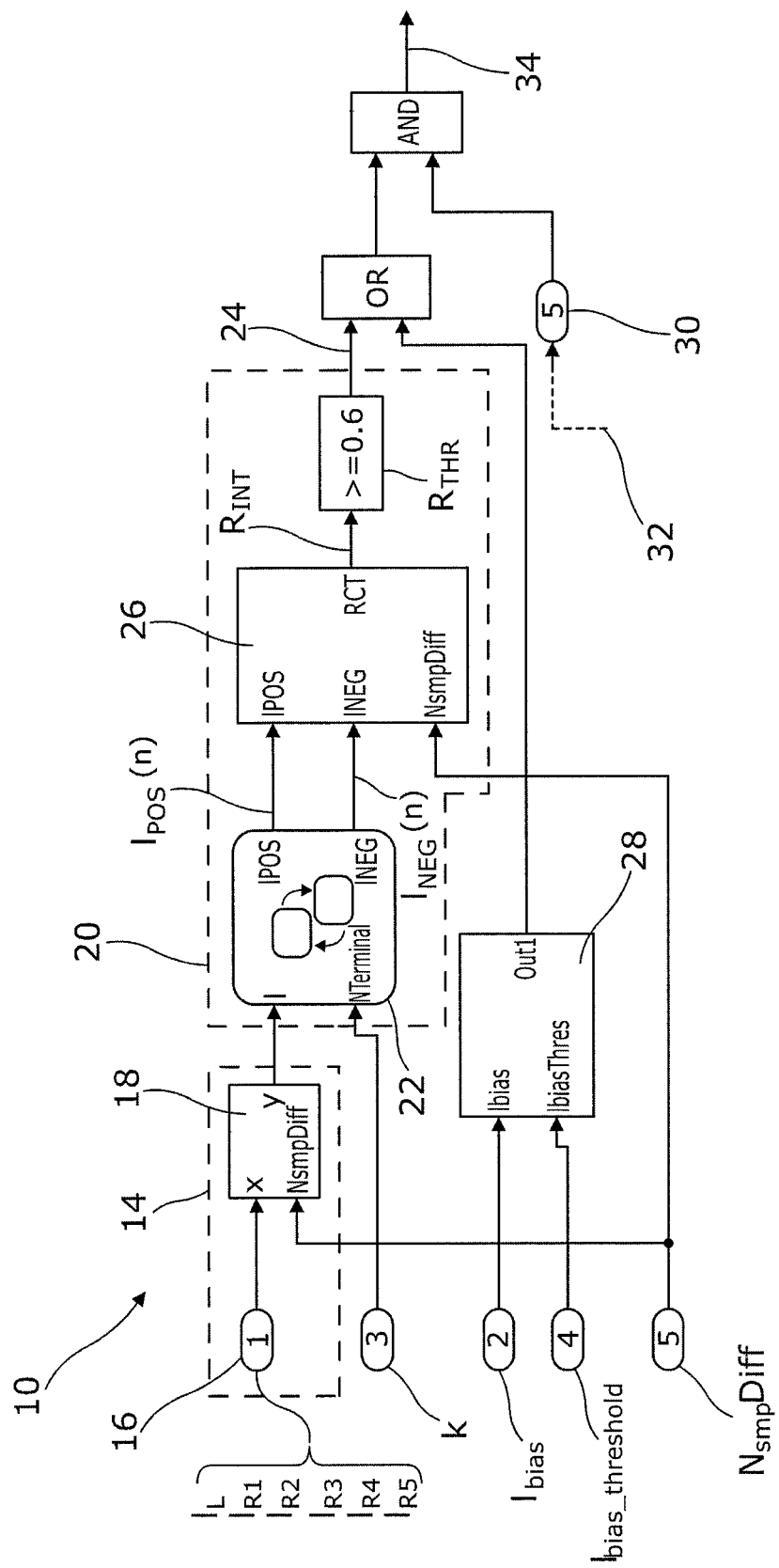
FIG. 1 shows a schematic view of a protection apparatus according to a first embodiment of the invention.

A protection apparatus according to a first embodiment of the invention is designated generally by reference numeral 10, and is shown in schematic form in FIG. 1.

Figure 2:
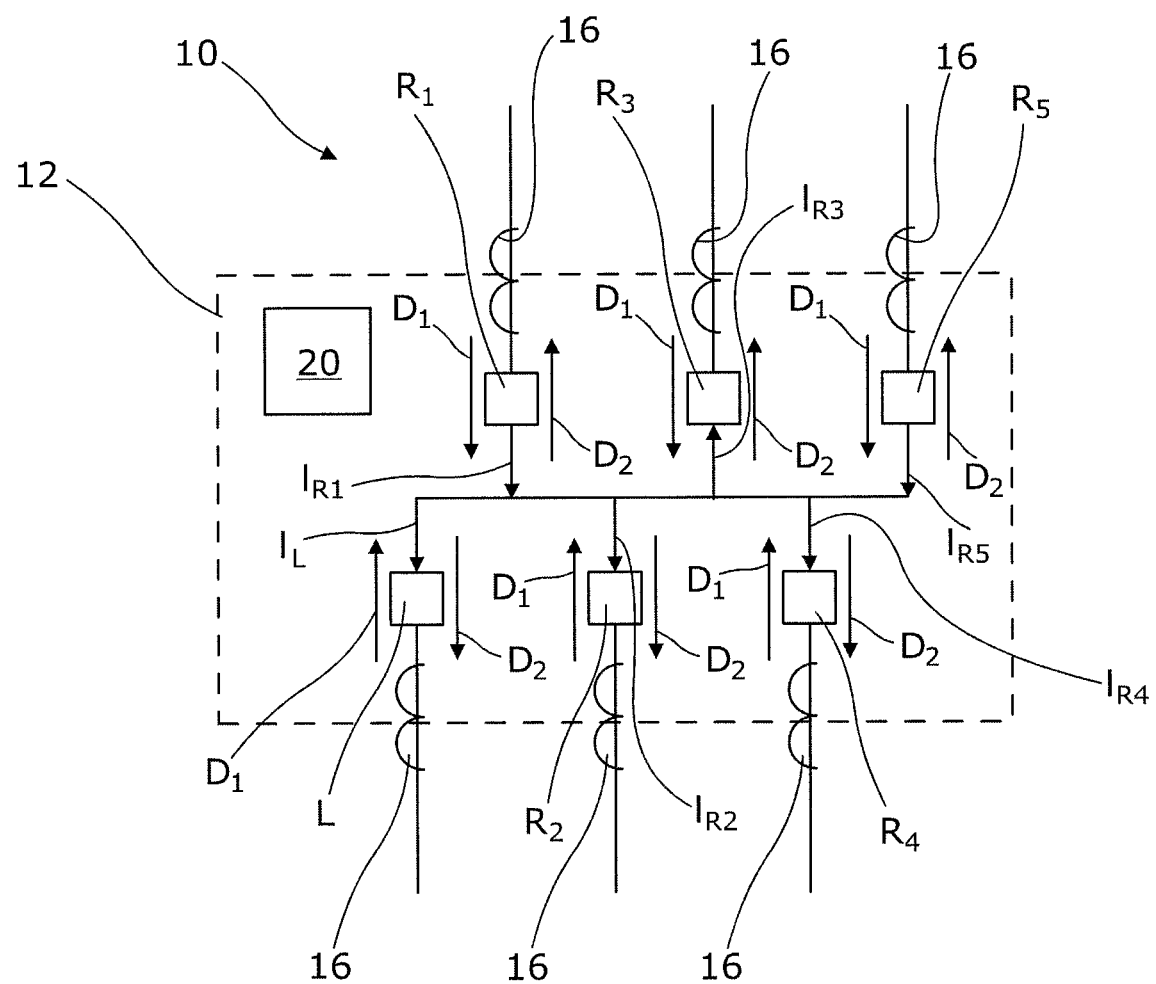
FIG. 2 shows a schematic view of a multi-terminal network that the protection apparatus shown in FIG. 1 is arranged to protect.

The protection apparatus 10 shown protects a multi-terminal electrical power network 12 which includes a plurality of electrically interconnected terminals, and more particularly includes a local terminal L and five remote terminals $R_1$, $R_2$, $R_3$, $R_4$, $R_5$ that are electrically interconnected with one another, as shown in FIG. 2.

Other embodiments of the protection apparatus may, however, protect a multi-terminal electrical power network with any number of electrically interconnected terminals.

The protection apparatus 10 includes a measurement apparatus 14 which, in the embodiment shown, includes six current transformers 16, each of which is operatively associated with a corresponding terminal L, $R_1$, $R_2$, $R_3$, $R_4$, $R_5$ to measure the respective terminal current $I_L$, $I_{R1}$, $I_{R2}$, $I_{R3}$, $I_{R4}$, $I_{R5}$ flowing at each terminal L, $R_1$, $R_2$, $R_3$, $R_4$, $R_5$.

Within the context of an embodiment of the present invention, a terminal current $I_L$, $I_{R1}$, $I_{R2}$, $I_{R3}$, $I_{R4}$, $I_{R5}$ is considered positive if it is flowing, at a particular moment in time, in a first direction $D_1$ relative to the corresponding terminal L, $R_1$, $R_2$, $R_3$, $R_4$, $R_5$, and a terminal current $I_L$, $I_{R1}$, $I_{R2}$, $I_{R3}$, $I_{R4}$, $I_{R5}$ is considered negative if it is flowing, at the same particular moment in time in a second direction $D_2$, opposite the first direction, relative to the corresponding terminal L, $R_1$, $R_2$, $R_3$, $R_4$, $R_5$.

In the embodiment shown the first direction $D_1$ relative to each terminal L, $R_1$, $R_2$, $R_3$, $R_4$, $R_5$ is towards each of the other terminals L, $R_1$, $R_2$, $R_3$, $R_4$, $R_5$ and the second direction $D_2$ relative to each terminal L, $R_1$, $R_2$, $R_3$, $R_4$, $R_5$ is away from each of the other terminals L, $R_1$, $R_2$, $R_3$, $R_4$, $R_5$. In other embodiments of the invention, however, the relative orientation of the first and second directions $D_1$, $D_2$ may be reversed.

In other embodiments of the invention the measurement apparatus may include current measurement devices which differ from the current transformers of the embodiment shown.

Returning to the embodiment shown, the measurement apparatus 14 additionally includes an average low pass filter 18 through which each of the measured terminal currents $I_L$, $I_{R1}$, $I_{R2}$, $I_{R3}$, $I_{R4}$, $I_{R5}$ passes to remove any distortion from these measurements that may have arisen if the corresponding current transformer 16 becomes saturated, i.e. the current being measured by a given current transformer 16 drives the flux within the transformer into a non-linear region of the transformer's response characteristic such that measurement errors may subsequently arise.

An example filtering effect that may be applied by the low pass filter 18 is:

$$y(n) = y(n-1) + 2\left[x(n) - x\left(n - \frac{NsmpDiff}{2}\right)\right] / NsmpDiff$$

where, x(n) is the input signal, i.e. a respective measured terminal current $I_L$, $I_{R1}$, $I_{R2}$, $I_{R3}$, $I_{R4}$, $I_{R5}$; y(n) is the output signal, i.e. the filtered terminal current measurement; and NsmpDiff is the number of samples per fundamental frequency cycle of the electrical power network 12 being protected.

Other filtering effects may, however, also be applied.

The protection apparatus 10 also includes a control unit 20 that is arranged in communication with each current transformer 16. In the embodiment shown the control unit 20 is a single centralised electronic device in the form of a programmable microcontroller, although other types of control units are also possible.

In other embodiments of the invention (not shown) the control unit may be formed from a number of separate control unit portions, each of which is defined by a separate electronic device that is arranged at or adjacent to one or more terminals L, $R_1$, $R_2$, $R_3$, $R_4$, $R_5$.

In any event, the control unit 20 is programmed to process the measured terminal currents $I_L$, $I_{R1}$, $I_{R2}$, $I_{R3}$, $I_{R4}$, $I_{R5}$ received from each current transformer 16 to obtain first and second summed values $I_{POS}(n)$, $I_{NEG}(n)$.

More particularly, the control unit 20 includes a current merging unit 22 which obtains a first summed value $I_{POS}(n)$ that is the sum at a given moment in time n of the or each terminal current $I_L$, $I_{R1}$, $I_{R2}$, $I_{R3}$, $I_{R4}$, $I_{R5}$ flowing in the first direction $D_1$ relative to a corresponding terminal L, $R_1$, $R_2$, $R_3$, $R_4$, $R_5$, i.e. the sum of the or each positive terminal current $I_L$, $I_{R1}$, $I_{R2}$, $I_{R3}$, $I_{R4}$, $I_{R5}$ at the various terminals L, $R_1$, $R_2$, $R_3$, $R_4$, $R_5$ at a given moment in time n, i.e. as given by:

$$I_{Pos} = \sum_{k \in Pos} i_k$$

where, k is the number of terminals L, $R_1$, $R_2$, $R_3$, $R_4$, $R_5$; and Pos is the set of terminals L, $R_1$, $R_2$, $R_3$, $R_4$, $R_5$ which each has a positive terminal current flowing thereat, i.e. a terminal current flowing in the first direction $D_1$ relative thereto.

The current merging unit 22 also obtains a second summed value $I_{NEG}(n)$ that is the sum at the same given moment in time n of the or each terminal current $I_L$, $I_{R1}$, $I_{R2}$, $I_{R3}$, $I_{R4}$, $I_{R5}$ flowing in the second direction $D_2$ relative to a corresponding terminal L, $R_1$, $R_2$, $R_3$, $R_4$, $R_5$, i.e. the sum of the or each negative terminal current $I_L$, $I_{R1}$, $I_{R2}$, $I_{R3}$, $I_{R4}$, $I_{R5}$ at the various terminals L, $R_1$, $R_2$, $R_3$, $R_4$, $R_5$ at the same given moment in time n, i.e. as given by:

$$I_{Neg} = \sum_{k \in Neg} i_k$$

where, k is the number of terminals L, $R_1$, $R_2$, $R_3$, $R_4$, $R_5$; and Neg is the set of terminals L, $R_1$, $R_2$, $R_3$, $R_4$, $R_5$ which each has a negative terminal current flowing thereat, i.e. a terminal current flowing in the second direction $D_2$ relative thereto.

The control unit 20 is also programmed to compare the phase of the first summed value $I_{POS}(n)$ with the phase of the second summed value $I_{NEG}(n)$ to determine whether a fault in the multi-terminal network 12 is internal or external to the multi-terminal network 12, and to thereafter produce internal fault output signal 24 when an internal fault is determined.

The control unit 20 includes a phase comparison unit 26 which carries out the aforementioned phase comparison.

More particularly, the phase comparison unit 26 considers whether the difference between the phases is 180° or 90°.

The phase comparison unit 26 does this by considering whether the difference between the phases is greater than or less than a boundary angle, which may be 135° but could be a higher or lower angle.

For example, if the phase difference is greater than 135° the phase comparison unit 26 makes a determination that the difference between the phases is 180°, which is indicative of an external fault, and if the phase difference is less than 135° the phase comparison unit makes a determination that the difference between the phases is 90°, which is indicative of an internal fault.

More particularly, in the embodiment shown the phase comparison unit 26 achieves the foregoing by carrying out a magnitude comparison algorithm, although it may also be achieved by carrying out some other form of algorithm such as a correlation algorithm or a Fourier based algorithm.

The phase comparison unit 26 carries out the said magnitude comparison algorithm by comparing a norm of a sum of the first and second summed values $I_{POS}(n)$, $I_{NEG}(n)$, e.g. a root mean square of the sum as given by $$\|I_{Pos}(n) + I_{Neg}(n)\|$$

with a norm of a difference between the first and second summed values $I_{POS}(n)$, $I_{NEG}(n)$, e.g. a root mean square of the difference as given by $$\|I_{Pos}(n) - I_{Neg}(n)\|$$

In other embodiments of the invention the phase comparison unit 26 may instead carry out the magnitude comparison algorithm by comparing an absolute mean or other order norm of a sum of the first and second summed values $I_{POS}(n)$, $I_{NEG}(n)$ with an absolute mean or another order norm of a difference between the first and second summed values $I_{POS}(n)$, $I_{NEG}(n)$.

In the embodiment described above, the phase comparison unit 26 establishes a discriminative ratio $R_{INT}$ which is based on the sum of the first and second summed values $I_{POS}(n)$, $I_{NEG}(n)$ and the difference between the first and second summed values $I_{POS}(n)$, $I_{NEG}(n)$, and then compares the said discriminative ration $R_{INT}$ with a threshold value $R_{THR}$.

In the embodiment shown the phase comparison unit 26 establishes a discriminative ratio $R_{INT}$ of the form:

$$R_{INT} = \frac{\|I_{Pos}(n) + I_{Neg}(n)\|}{\|I_{Pos}(n) - I_{Neg}(n)\|}$$

and compares this to a threshold value $R_{THR}$ of 0.6.

If the discriminative ratio $R_{INT}$ is greater than or equal to the threshold value $R_{THR}$ the control unit 20 produces the internal fault output signal 24 that is indicative of an internal fault having occurred.

In other embodiments of the invention the threshold value $R_{THR}$ may be selected from the range 0.4 to 0.9.

Prior to the phase comparison unit 26 carrying out the aforementioned magnitude comparison algorithm, each of the first and second summed values $I_{POS}(n)$, $I_{NEG}(n)$ is normalized to increase the sensitivity of the protection apparatus 10 in dealing with faults.

An example manner in which the said first and second summed values $I_{POS}(n)$, $I_{NEG}(n)$ may be normalized is by applying:

$$y(n)=x(n)/\|x(n)\|$$

where, $x(n)$ is the input signal, i.e. a respective first or second summed value $I_{POS}(n)$, $I_{NEG}(n)$;
$y(n)$ is output signal, i.e. the normalized first or second summed value; and $\|x(n)\|$ is either a Root Mean Square operator $RMS[x(n)]$ which is given by:

$$RMS[x(n)] = \sqrt{\frac{1}{NsmpDiff} \sum_{k=n-NsmpDiff+1}^{n} |x(k)|^2}$$

or is an Absolute Mean operator $AM[x(n)]$, which is given by:

$$AM[x(n)] = \frac{1}{NsmpDiff} \sum_{k=n-NsmpDiff+1}^{n} |x(k)|$$

and where, NsmpDiff is the number of samples per fundamental frequency cycle of the electrical power network 12 being protected.

In addition to the foregoing the protection apparatus 10 includes a fault severity determination unit 28 to determine the severity of a fault.

The fault severity determination unit 28 carries out the said determination by comparing a bias current $I_{bias}$ with a current threshold $I_{bias-threshold}$ and indicating, by way of an output signal of 1, that a fault is slight, i.e. as is the case when no saturation of a current transformer 16 within the measurement apparatus 14 has occurred, while ever the bias current $I_{bias}$ remains below the current threshold $I_{bias-threshold}$.

Conversely the fault severity determination unit 28 indicates, by way of an output signal of 0, that a fault is severe when the bias current $I_{bias}$ exceeds the current threshold $I_{bias-threshold}$. In this regard the bias current $I_{bias}$ is given by:

$$I_{bias}=(\Sigma_{k=1}^{M}\|i_{TK}\|)/2$$

where, M is the number of terminals; $i_{Tk}$ is the samples of current at a kth terminal; and "$\| \ \|$" is a Root Mean Square operator or Absolute Mean operator.

The protection apparatus shown in FIG. 2 also further includes a secondary protection apparatus input 30 which is arranged to receive a trip signal 32 from a secondary protection apparatus, such as a differential protection apparatus (not shown).

Moreover, the protection apparatus 10 is configured to send a master trip signal 34 to a network protection device, and thereby cause activation of the network protection device, in dependence of the secondary protection apparatus input 30 receiving a trip signal 32.

In use the protection apparatus 10 described hereinabove operates as follows.

Figure 3A:
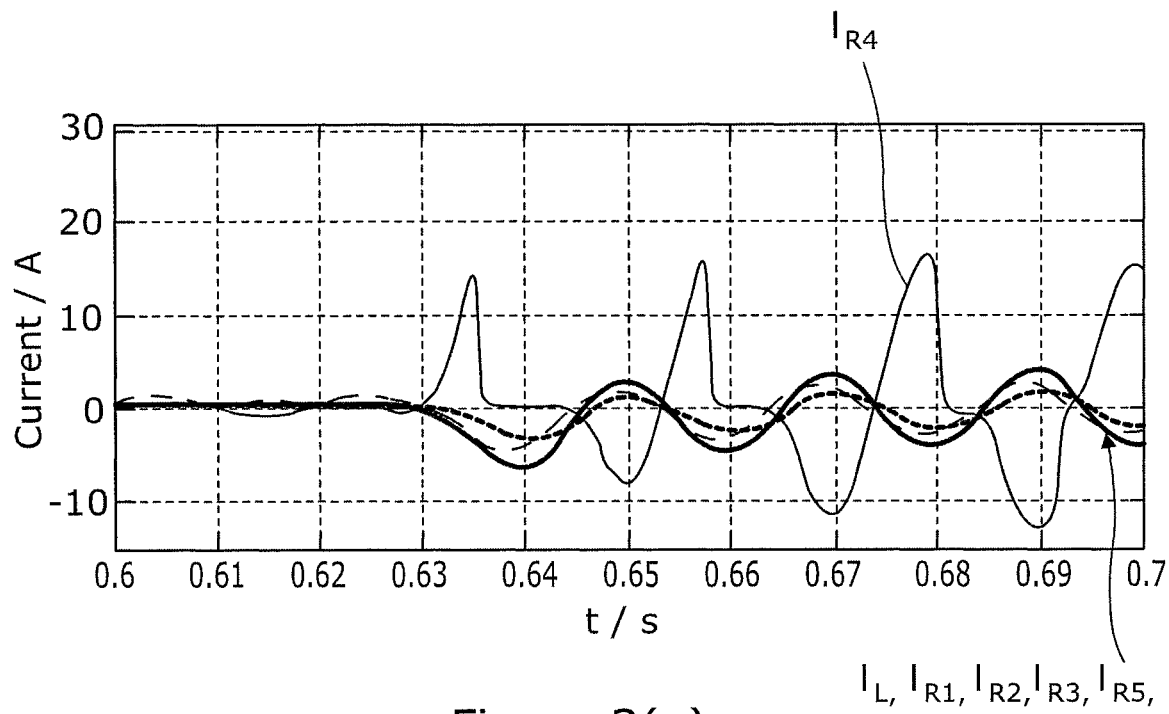
FIG. 3A shows individual measured terminal currents in the event of an external fault.

In the event of an external fault in, by way of example the power network extending beyond the fourth remote terminal $R_4$, the terminal current $I_{R4}$ at the fourth remote terminal $R_4$ flows in the opposite direction, i.e. in the opposite sense, to the terminal currents $I_L$, $I_{R1}$, $I_{R2}$, $I_{R3}$, $I_{R5}$ at the other remaining terminals L, $R_1$, $R_2$, $R_3$, $R_5$, as shown in FIG. 3(a).

In other words, at a given moment in time when the terminal current $I_{R4}$ at the fourth remote terminal $R_4$ is flowing in the first direction $D_1$ relative to the fourth remote terminal $R_4$, each of the remaining terminal currents $I_L$, $I_{R1}$, $I_{R2}$, $I_{R3}$, $I_{R5}$ will be flowing in the second direction $D_2$ relative to the corresponding remaining terminals L, $R_1$, $R_2$, $R_3$, $R_5$.

Figure 3B:
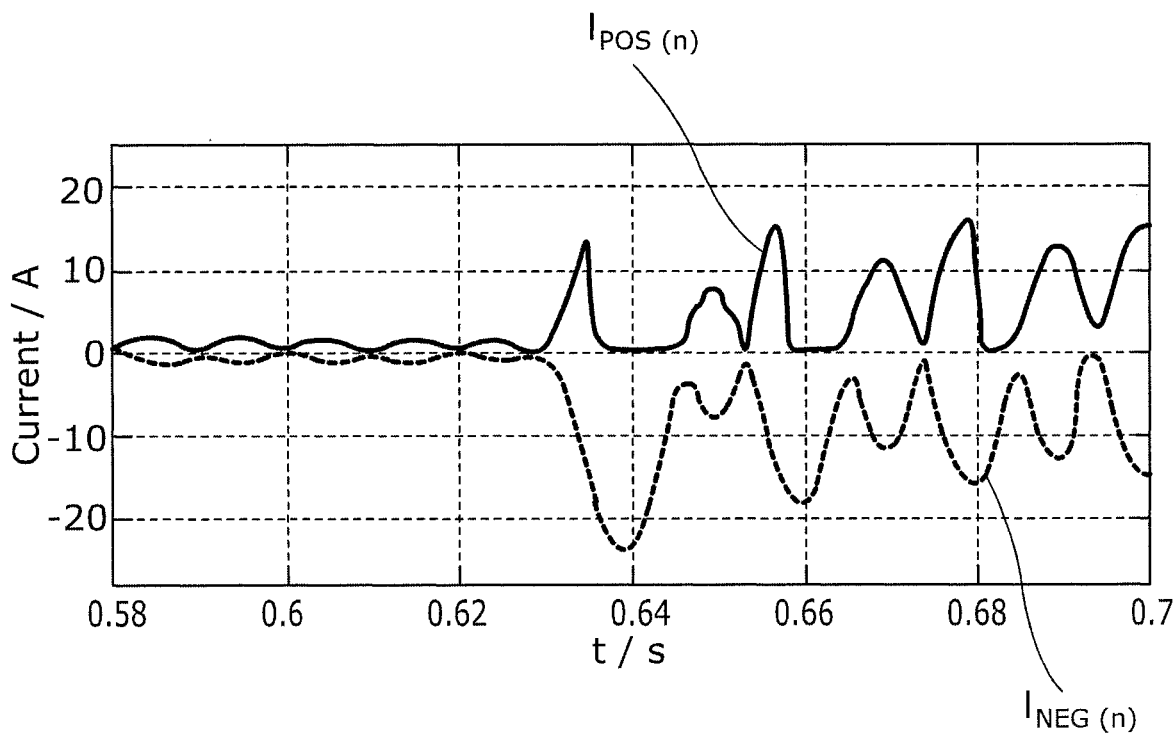
FIG. 3B shows respective first and second summed value waveforms in the event of an external fault.

The control unit 20, and more particularly the current merging unit 22 thereof, obtains, i.e. calculates, the first and second summed values $I_{POS}(n)$, $I_{NEG}(n)$ which are shown as respective time-varying waveforms in FIG. 3B. As can be seen from FIG. 3B, the phases of the first and second summed value waveforms $I_{POS}(n)$, $I_{NEG}(n)$ are opposite one another, i.e. the phase difference between the said phases is 180°. As a result, the discriminative ratio $R_{INT}$ obtained from:

$$R_{INT} = \frac{\|I_{Pos}(n) + I_{Neg}(n)\|}{\|I_{Pos}(n) - I_{Neg}(n)\|}$$

lies below the threshold value $R_{THR}$ of 0.6, and so the control unit 20 does not produce an internal fault output signal 24.

Notwithstanding the above, in instances where the fault severity determination unit 28 continues to indicate that the fault is slight, that is to say, there is no possibility that saturation of one or more of the various current transformers 16 has occurred, i.e. by producing an output signal of 1, the protection apparatus 10 remains able to send a master trip signal 34 to a network protection device, e.g. a circuit breaker or relay, in the event of receiving a trip signal 32 (via its secondary protection apparatus input 30) from a secondary protection apparatus such as a differential protection apparatus. Such a differential protection apparatus is more sensitive to faults than the protection apparatus of an embodiment of the present invention but typically is only able to provide a reliable indication of a fault, i.e. is only accurate, when there is no saturation of the current transformers 16 providing it with terminal current measurements.

Figure 4A:
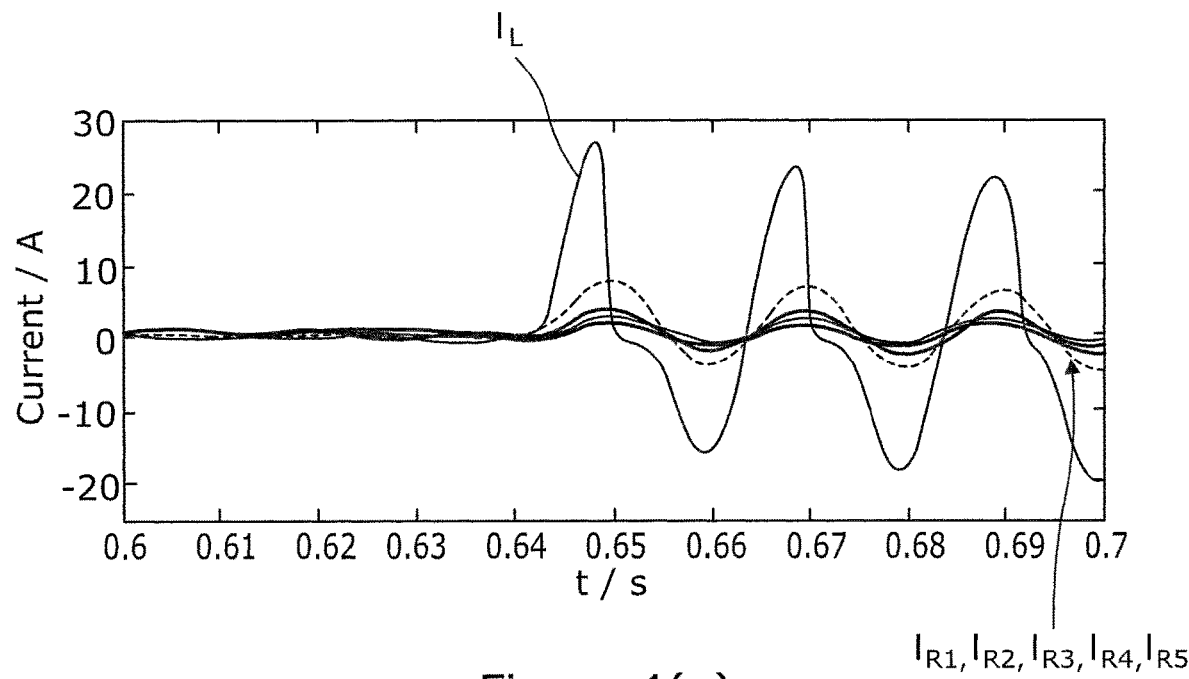
FIG. 4A shows individual measured terminal currents in the event of an internal fault.

In the event of an internal fault adjacent to, by way of example the local terminal L, all of the terminal currents $I_L$, $I_{R1}$, $I_{R2}$, $I_{R3}$, $I_{R4}$, $I_{R5}$ continue to flow in the same direction, i.e. continue to have the same sense, as shown in FIG. 4A.

In other words, at a given moment in time all the terminal currents $I_L$, $I_{R1}$, $I_{R2}$, $I_{R3}$, $I_{R4}$, $I_{R5}$ will be flowing in the same first or second direction $D_1$, $D_2$ relative to each of the corresponding terminals L, $R_1$, $R_2$, $R_3$, $R_4$, $R_5$.

Figure 4B:
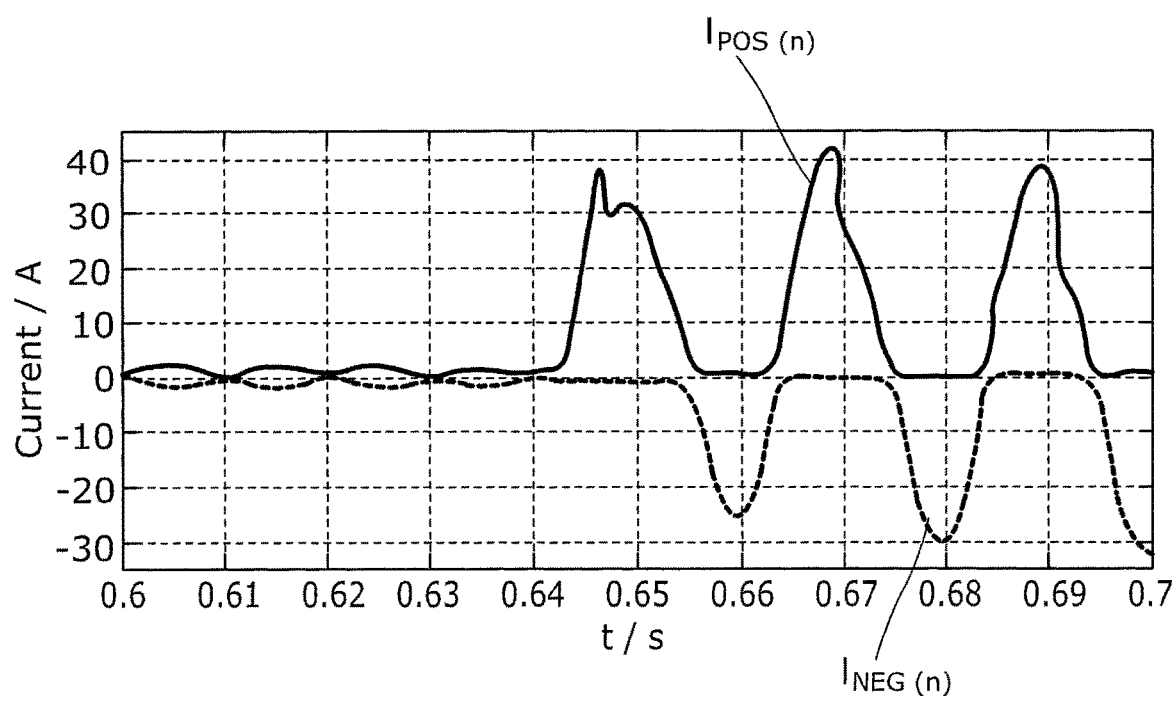
FIG. 4B shows respective first and second summed value waveforms in the event of an internal fault.

The control unit 20, and more particularly the current merging unit 22 thereof, again obtains, i.e. calculates, the first and second summed values $I_{POS}(n)$, $I_{NEG}(n)$ which are shown as respective time-varying waveforms in FIG. 4B As can be seen from FIG. 4B, the phases of the first and second summed value waveforms $I_{POS}(n)$, $I_{NEG}(n)$ are shifted by 90° relative to one another, i.e. the phase difference between the said phases is 90°. As a result, the discriminative ratio $R_{INT}$ obtained from:

$$R_{INT} = \frac{\|I_{Pos}(n) + I_{Neg}(n)\|}{\|I_{Pos}(n) - I_{Neg}(n)\|}$$

is greater than the threshold value $R_{THR}$ of 0.6, and so the control unit 20 produces the internal fault output signal 24 and thereby indicates that an internal fault has occurred.

Thereafter, if the fault severity determination unit 28 indicates that the fault is severe (such that saturation of one or more of the various current transformers 16 is likely to have occurred), i.e. by producing an output signal of 0, the protection apparatus 10 is able to send a master trip signal 34 to a network protection device in the event also of receiving a trip signal 32 (via its secondary protection apparatus input 30) from a secondary protection apparatus confirming that such protective action is required.

This written description uses examples to disclose the invention, including the preferred embodiments, and to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A protection apparatus, for protecting a multi-terminal electrical power network, comprising:
    a measurement apparatus configured to measure a respective terminal current flowing at each terminal in a multi-terminal network, wherein the multi-terminal network comprises a plurality of electrically interconnected terminals; and
    a control unit configured to:
        process the measured terminal currents and obtain a first summed value and a second summed value, wherein the first summed value is a sum at a given time of each terminal current is positive relative to a corresponding terminal, and the second summed value is a sum at the same given time of each terminal current is negative relative to the corresponding terminal, and
        compare the phase of the first summed value with the phase of the second summed value to determine whether a fault in the multi-terminal network is internal or external to the multi-terminal network and produce an internal fault output signal upon the determination of an internal fault.

2. The protection apparatus of claim 1, wherein the control unit further comprises determining whether the difference between the phases is one of 180° or 90°.

3. The protection apparatus of claim 2, wherein the control unit is configured to carry out one of:
    a correlation algorithm;
    a Fourier based algorithm; and
    a magnitude comparison algorithm.

4. The protection apparatus of claim 3, wherein the control unit carrying out a magnitude comparison algorithm comprises the control unit comparing a sum of the first summed value and the second summed value with a difference between the first summed value and the second summed value.

5. The protection apparatus claim 3, wherein the control unit carrying out a magnitude comparison algorithm comprises the control unit comparing the norm of a sum of the first summed value and the second summed value with the norm of a difference between the first summed value and the second summed value.

6. The protection apparatus of claim 3, wherein the control unit carrying out a magnitude comparison algorithm comprises the control unit being configured to determine a discriminative ratio based on the sum of the first summed value and the second summed value and the difference between the first summed value and the second summed value and compare the discriminative ratio with a threshold value.

7. The protection apparatus of claim 3, wherein the control unit is configured to normalize each of the first and second summed values prior to determining whether the difference between the phases is one of 180° or 90°.

8. The protection apparatus of claim 3, wherein the measurement apparatus comprises one or more filters configured to remove distortion from the measured terminal currents.

9. The protection apparatus according to claim 3, further comprising a fault severity determination unit configured to determine the severity of a fault.

10. The protection apparatus of claim 3, further comprising a secondary protection apparatus input configured to receive a trip signal from a secondary protection apparatus, wherein the protection apparatus is configured to send a master trip signal to a network protection device in dependence of the secondary protection apparatus input receiving a trip signal.

* * * * *